(12) United States Patent
Chaney et al.

(10) Patent No.: US 8,455,839 B2
(45) Date of Patent: Jun. 4, 2013

(54) CLEANING OF AN EXTRACTION APERTURE OF AN ION SOURCE

(75) Inventors: Craig R. Chaney, Lanesville, MA (US); Alexander S. Perel, Danvers, MA (US); Neil J. Bassom, Hamilton, MA (US); Leo V. Klos, Newburyport, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 626 days.

(21) Appl. No.: 12/720,960

(22) Filed: Mar. 10, 2010

(65) Prior Publication Data
US 2011/0220144 A1 Sep. 15, 2011

(51) Int. Cl.
*H01J 37/28* (2006.01)
*B08B 7/00* (2006.01)

(52) U.S. Cl.
USPC ......... 250/423 R; 250/492.21; 134/6; 134/9; 15/97.1

(58) Field of Classification Search
USPC ............ 250/423 R, 426, 492.21, 526; 134/2, 134/6, 9, 15; 15/52, 81, 93.1, 97.1
See application file for complete search history.

(56) References Cited

U.S. PATENT DOCUMENTS

| | | | | |
|---|---|---|---|---|
| 6,992,311 B1 * | 1/2006 | Ring et al. | ............... | 250/492.21 |
| 7,446,326 B2 * | 11/2008 | Chaney et al. | ............ | 250/492.21 |
| 7,491,947 B2 * | 2/2009 | Cobb et al. | .................... | 250/426 |
| 7,586,109 B2 * | 9/2009 | Perel et al. | ............... | 250/492.21 |
| 7,655,932 B2 * | 2/2010 | Hatem et al. | ............. | 250/492.21 |
| 7,750,320 B2 * | 7/2010 | Ferrara et al. | ............ | 250/492.21 |
| 7,791,047 B2 | 9/2010 | Horsky et al. | | |
| 7,820,981 B2 | 10/2010 | Horsky et al. | | |
| 7,888,662 B2 * | 2/2011 | Biloiu et al. | ............. | 250/492.21 |
| 8,003,957 B2 * | 8/2011 | Chaney et al. | ............ | 250/492.21 |
| 8,003,959 B2 * | 8/2011 | Platow et al. | ............ | 250/492.21 |
| 8,071,956 B2 * | 12/2011 | Chaney et al. | ............ | 250/423 R |
| 8,263,944 B2 * | 9/2012 | Koo et al. | ...................... | 250/424 |
| 8,330,127 B2 * | 12/2012 | Low et al. | ................ | 250/492.21 |

* cited by examiner

Primary Examiner — Bernard E Souw

(57) ABSTRACT

An ion source includes an arc chamber housing defining an arc chamber having an extraction aperture, and a wiper. The wiper is positioned within the arc chamber in a parked position and configured to be driven from the parked position to operational positions to clean the extraction aperture. A cleaning sub-assembly for an ion source includes a wiper configured to be positioned within an arc chamber of the ion source when in a parked position and driven from the parked position to operational positions to clean an extraction aperture of the ion source.

14 Claims, 6 Drawing Sheets

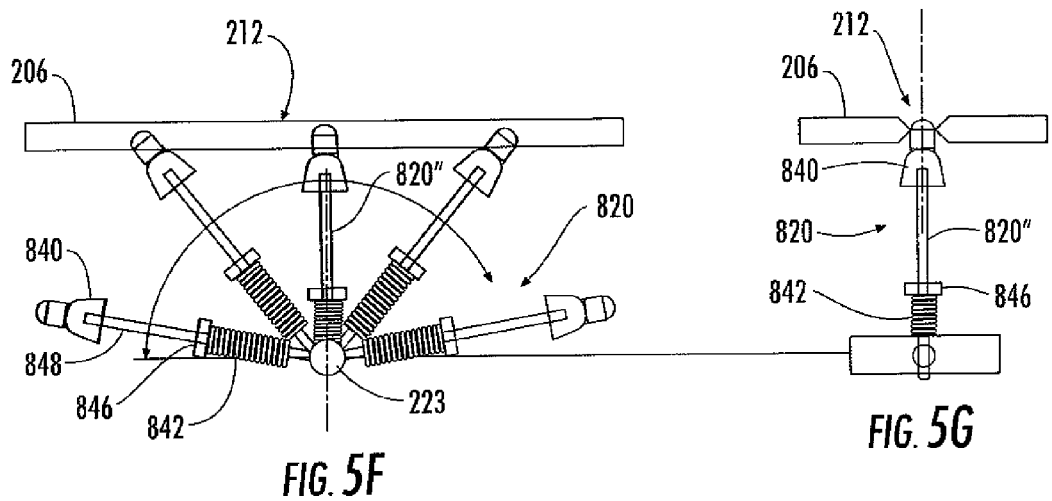
FIG. 5F
FIG. 5G
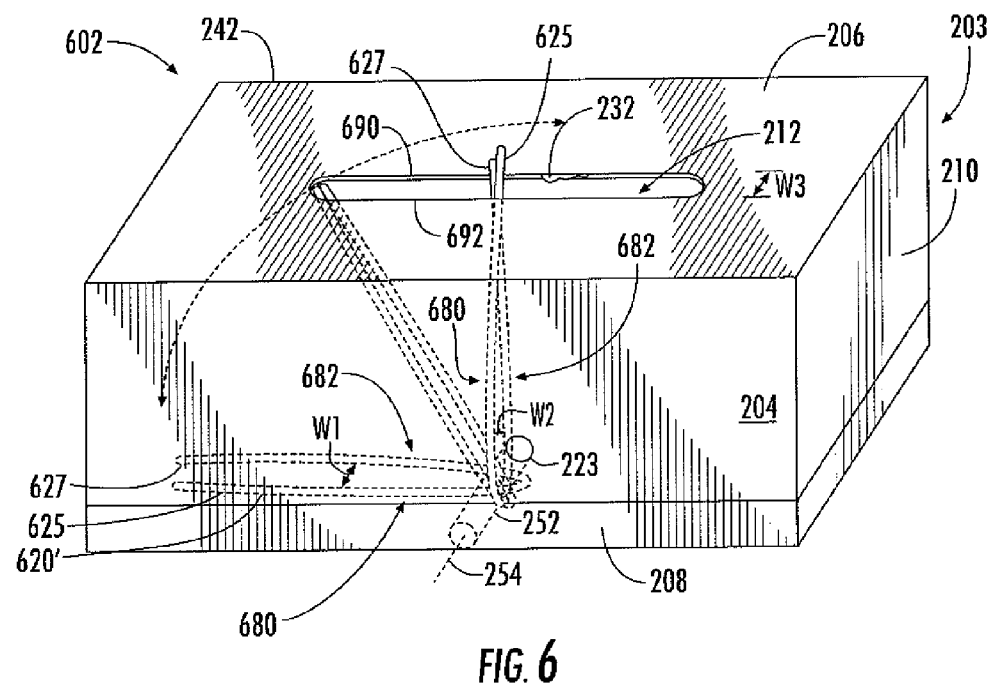
FIG. 6

CLEANING OF AN EXTRACTION APERTURE OF AN ION SOURCE

CROSS REFERENCE TO RELATED APPLICATIONS

This application is related to U.S. application Ser. No. 12/720,933 filed Mar. 10, 2010, which is incorporated herein by reference.

FIELD

This disclosure relates generally to ion sources, and more particularly to cleaning of an extraction aperture of an ion source.

BACKGROUND

An ion source is a critical component of an ion implanter. An ion source includes an arc chamber housing defining an arc chamber. The arc chamber housing also has an extraction aperture through which a well defined ion beam is extracted by an extraction electrode assembly positioned proximate the extraction aperture. The ion beam passes through the beam line of the ion implanter and is delivered to a target workpiece such as a semiconductor wafer. The ion source is required to generate a stable, well-defined, uniform ion beam for a variety of different ion species. It is also desirable to operate the ion source in a semiconductor production facility for extended periods of time without the need for maintenance or repair.

In operation, a desired dopant gas is provided to the arc chamber of the ion source. The dopant gas is ionized into a plasma by exposing the dopant gas to energetic electrons. The energetic electrons may be generated in a number of ways. One way to generate electrons is to position a filament proximate a cathode as is done with an indirectly heated cathode (IHC) ion source. The filament is generally sheltered from the plasma in the arc chamber to which the relatively massive cathode is exposed. When heated by the filament, the cathode supplies energetic electrons. A well defined ion beam is extracted through the extraction aperture by a biased extraction electrode assembly positioned proximate the extraction aperture.

Over time, undesirable deposits may form on the extraction aperture. The presence and rate of formation of such deposits may be influenced by the selected dopant gas. For some fluorine containing dopant gases such as boron trifluoride ($BF_3$), germanium tetrafluoride ($GeF_4$), and silicon tetrafluoride ($SiF_4$), undesirable deposits such as tungsten may form on the extraction aperture. For other molecular species, the rate of undesirable deposit formation may be even more severe. For example, for carborane ($C_2B_{10}H_{12}$), undesirable deposits such as carbon and boron may quickly form on the extraction aperture. Such deposits on the extraction aperture can block portions of the ion beam extracted there from.

Such undesirable deposits formed on the extraction aperture may adversely affect beam uniformity, beam current, and ion source lifetime. For example, any beam blockage at the extraction aperture may impact the uniformity of the ion beam extracted there from. These non uniformities may then be transmitted and magnified as the ion beam passes down the beam line to the target workpiece. Such magnification may be exacerbated in ion implanters that provide a "ribbon beam" having an approximately rectangular cross section at a workpiece plane defined by a front surface of the target workpiece. The long dimension of the ribbon beam at the workpiece plane may be at least 10 times greater than the long dimension of the beam extracted from the extraction aperture thus magnifying any blockage issues of the ion beam at the extraction aperture. Beam uniformity problems can contribute to dose uniformity problems at the workpiece plane. Dose uniformity requirements continue to become more stringent as some current specifications require dose uniformity of less than 1% variation at the workpiece plane for ribbon beams. An ion beam with poor beam uniformity due to deposits on the extraction aperture may be improved with tuning techniques that reduce beam current levels. In other words, the beam current of the ion beam extracted from the source would be lowered from desired levels to improve beam uniformity. Lowered beam currents can adversely impact throughput of the associated ion implanter or the number of workpieces processed per time period. Finally, ion source lifetime may be limited by undesirable deposits on the extraction aperture.

Some conventional techniques for removing undesirable deposits in an ion source include introducing particular cleaning gases such as reactive gases into the arc chamber. Although largely effective, such cleaning gas techniques may take 10-60 minutes to complete and, of course, require the cleaning gas and flow control of the same. In addition, the number of molecules in the cleaning gas must be at least as big as the number of atoms to be cleaned. For example, two hours of accumulated deposits might be cleaned in 10 minutes only with a very high flow rate of the cleaning gas. Therefore, the length of time to complete such a cleaning operation adversely impacts throughput.

Accordingly, it would be desirable to provide a technique for cleaning an extraction aperture of an ion source which overcomes the above-described inadequacies and shortcomings.

SUMMARY

According to a first aspect of the disclosure an ion source is provided. The ion source includes an arc chamber housing defining an arc chamber having an extraction aperture, and a wiper. The wiper is positioned within the arc chamber in a parked position and configured to be driven from the parked position to operational positions to clean the extraction aperture.

According to yet another aspect of the disclosure, a cleaning sub-assembly for an ion source is provided. The cleaning sub-assembly includes a wiper configured to be positioned within an arc chamber of the ion source when in a parked position and driven from the parked position to operational positions to clean an extraction aperture of the ion source.

According to yet another aspect of the disclosure, a method of cleaning an extraction aperture of an ion source is provided. The method includes positioning a wiper within an arc chamber of the ion source in a parked position, and driving the wiper across the extraction aperture during a cleaning operation to clean the extraction aperture.

The present disclosure will now be described in more detail with reference to exemplary embodiments as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

For a better understanding of the present disclosure, reference is made to the accompanying drawings, in which like elements are referenced with like numerals, and in which:

FIGS. 5A-5G are schematic side and front views of different wiper embodiments;

FIG. 6 is a schematic perspective view of an ion source having the wiper of FIG. 5C;

DETAILED DESCRIPTION

Figure 1:
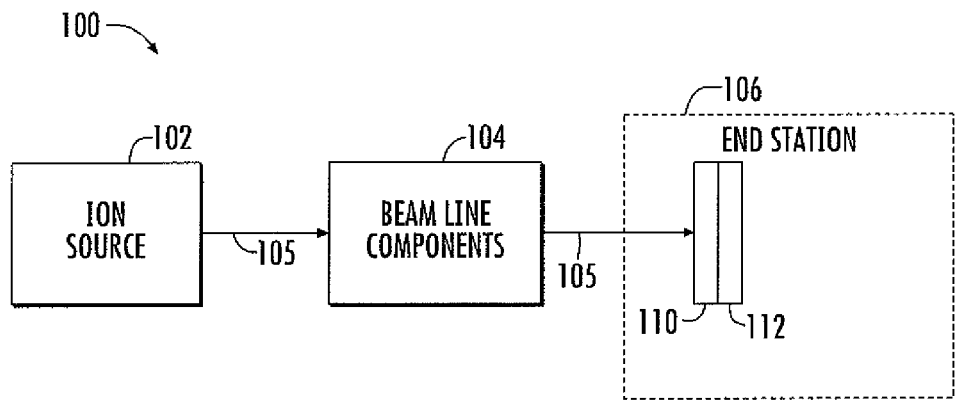
FIG. 1 is a simplified schematic block diagram of an ion implanter.

Turning to FIG. 1, a simplified schematic block diagram of an ion implanter 100 is illustrated. The ion implanter 100 includes an ion source 102 consistent with an embodiment of the disclosure, beam line components 104, and an end station 106 that supports one or more workpieces such as a workpiece 110. The ion source 102 generates an ion beam 105 that is directed via the beam line components 104 to the workpiece 110.

The beam line components 104 may include components known to those skilled in art to control and direct the ion beam 105 towards the workpiece 110. Some examples of such beam line components 104 include, but are not limited to, a mass analyzing magnet, a resolving aperture, ion beam acceleration and/or deceleration columns, an energy filter, and a collimator magnet or parallelizing lens. Those skilled in the art will recognize alternative and/or additional beam line components 104 that may be utilized in the ion implanter 100.

The end station 106 supports one or more workpieces, such as workpiece 110, in the path of ion beam 105 such that ions of the desired species strike the workpiece 110. The workpiece 110 may be, for example, a semiconductor wafer or another object receiving ion treatment. The end station 106 may include a platen 112 to support the workpiece 110. The platen 112 may secure the workpiece 110 using electrostatic forces. The end station 106 may also include a scanner (not illustrated) for moving the workpiece 110 in a desired direction.

The end station 106 may also include additional components known to those skilled in the art. For example, the end station 106 typically includes automated workpiece handling equipment for introducing workpieces into the ion implanter 100 and for removing workpieces after ion treatment. It will be understood to those skilled in the art that the entire path traversed by the ion beam is evacuated during ion treatment.

The ion implanter 100 may also have a controller (not illustrated) to control a variety of subsystems and components of the ion implanter 100.

Figure 2:
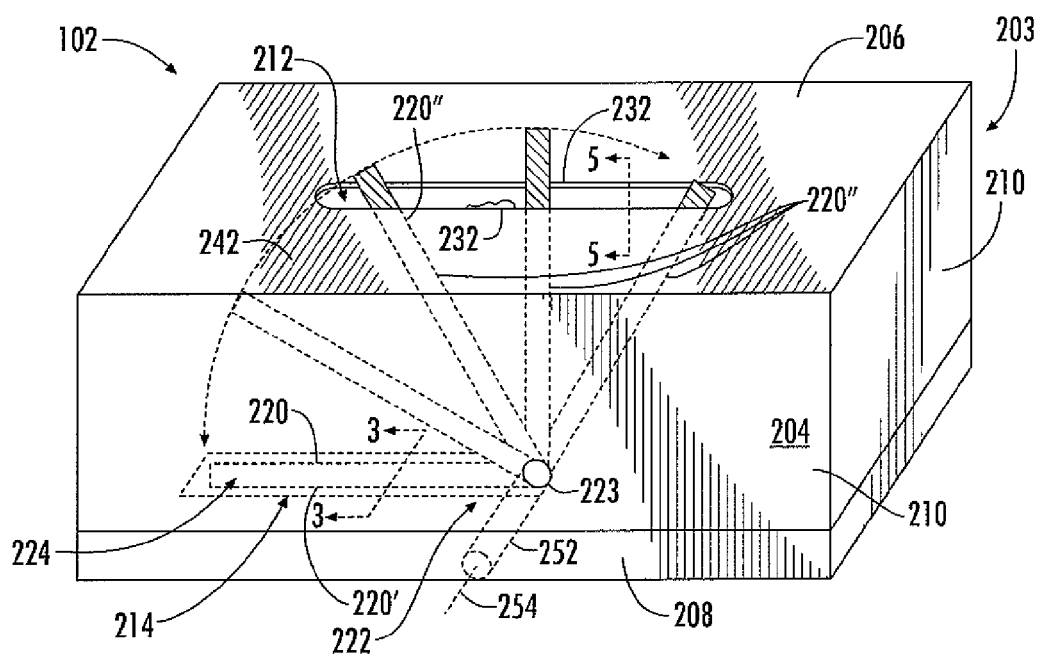
FIG. 2 is a schematic perspective view of an ion source consistent with an embodiment of the disclosure.

Turning to FIG. 2, a schematic perspective view of an ion source 102 consistent with an embodiment of the disclosure is illustrated. For clarity of illustration, some components of the ion source 102 not necessary for an understanding of the disclosure are not illustrated. The ion source includes an arc chamber housing 203 defining an arc chamber 204. The arc chamber housing 203 also defines an extraction aperture 212 through which a well defined ion beam 105 is extracted. The ion beam 105 is extracted from plasma within the arc chamber 204 by an extraction electrode assembly (not illustrated) positioned proximate the extraction aperture 212.

The arc chamber housing 203 may further include a face plate 206 having portions defining the extraction aperture 212, a floor 208 positioned opposite the face plate 206 and four upstanding side walls 210 coupled to the face plate 206 and floor 208 to define the interior arc chamber 204. A wiper 220 is positioned within the arc chamber 204 in a parked position 220'. The wiper 220 may include a bar, brush, plate, wire, and may be fabricated, in part, of refractory metals such as tungsten, molybdenum, tantalum, rhenium, and carbon and other high temperature materials including ceramics, aluminum oxide ($Al_2O_3$), sapphire, and zirconium. The wiper 220 may be flexible or rigid or some combination thereof.

The wiper 220 is configured to be driven from the parked position 220' to operational positions 220" to clean the extraction aperture 212. The wiper 220 may have one end 222 secured to a pivot point 223, and another unsecured end 224 configured to travel an arced path 242. The unsecured end 224 of the wiper 220 contacts portions of the face plate 206 defining the extraction aperture 212 to clean deposits 232 from the same. When not in use, the wiper 220 may be parked in a parked position 220' within a recessed portion 214 of the arc chamber housing 203. In one instance, the floor 208 has the recessed portion 214 to accept the wiper 220.

In operation, a dopant gas from a dopant gas source is provided to the arc chamber 204. The selected dopant gas depends, in part, on the desired dopant element. For instance, the dopant element may include boron (B), germanium (Ge), phosphorous (P), or silicon (Si) and the selected dopant gases may include $BF_3$, $GeF_4$, or $SiF_4$ to name only several. In other instances, a vaporizer may be needed to vaporize a solid dopant material such as carborane ($C_2B_{10}H_{12}$) into a dopant gas to provide to the arc chamber 204.

Over time, undesirable deposits 232 may form on the extraction aperture 212. The undesirable deposits 232 may be tungsten for some fluorine-containing dopant gases, or carbon and/or boron when running $C_2B_{10}H_{12}$. Regardless of the type, the undesirable deposits 232 on the extraction aperture 212 can block portions of the ion beam 105 extracted therefrom.

The wiper 220 can advantageously clean the aperture 212 by removing most, if not all, of any deposits 232. The wiper 220 may be coupled to a shaft 252 at a pivot point 223. When the shaft is rotated about axis 254, the wiper 220 pivots about the pivot point 223 and the unsecured end 224 of the wiper 220 travels an arced path 242. The unsecured end 224 of the wiper 220 contacts those portions of the face plate 206 defining the extraction aperture 212 to clean the same.

Figure 3A:
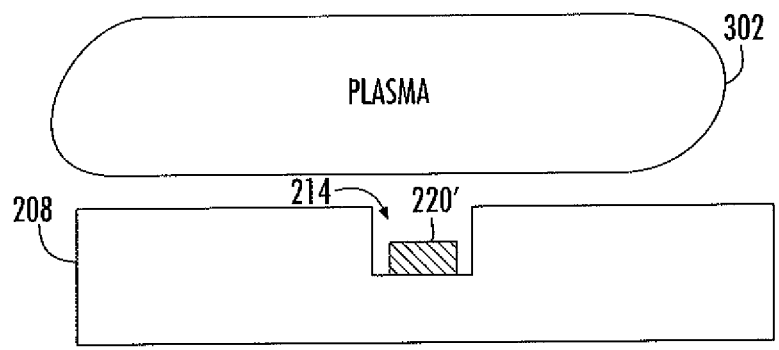
FIG. 3A is a cross sectional view of the floor of the arc chamber housing of FIG. 2 taken along the line 3-3 of FIG. 2 showing one embodiment of a wiper.
Figure 3B:
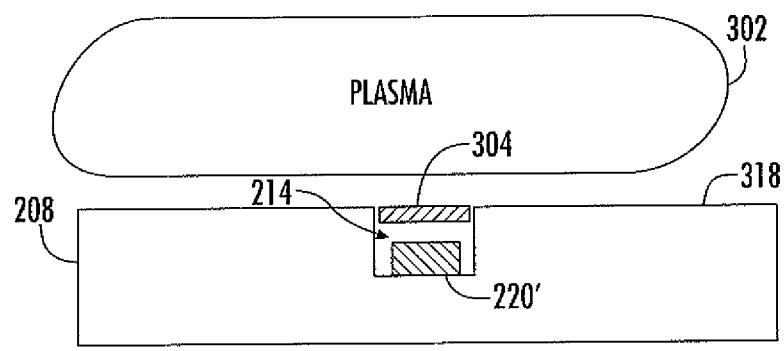
FIG. 3B is a cross sectional view of the floor of the arc chamber housing of FIG. 2 taken along the line 3-3 of FIG. 2 showing another embodiment of a wiper.

Turning to FIG. 3A, a cross sectional view of the floor 208 taken along the line 3-3 of FIG. 2 more particularly illustrates the recessed portion 214 for accepting the wiper 220 in the parked position 220'. The recessed portion 214 enables the wiper 220 to be positioned further away from the harsh environment of the plasma 302 formed within the arc chamber 204 during operation of the ion source 102. To further protect the wiper 220 from the harsh environment of the plasma 302, a cover 304 may be provided relative to the wiper 220 as illustrated in the cross sectional view of FIG. 3B. The cover 304 may be an elongated rectangular shaped portion which may be fabricated of refractory metals such as tungsten, molybdenum, tantalum, rhenium, and carbon and other high temperature materials including ceramics, aluminum oxide ($Al_2O_3$), sapphire, and zirconium. In one embodiment, the cover 304 is fixed relative to the wiper 220 and configured to pivot about the pivot point 223 with the wiper 220. When the wiper 220 and cover 304 are in the parked position 220' of FIG. 3B, the cover 304 further protects the wiper 220 positioned deeper within the recessed portion 214 of the floor 208. The cover 304 may further be positioned to be flush with a plasma facing surface 318 of the floor 208 as illustrated in FIG. 3B.

Figure 4:
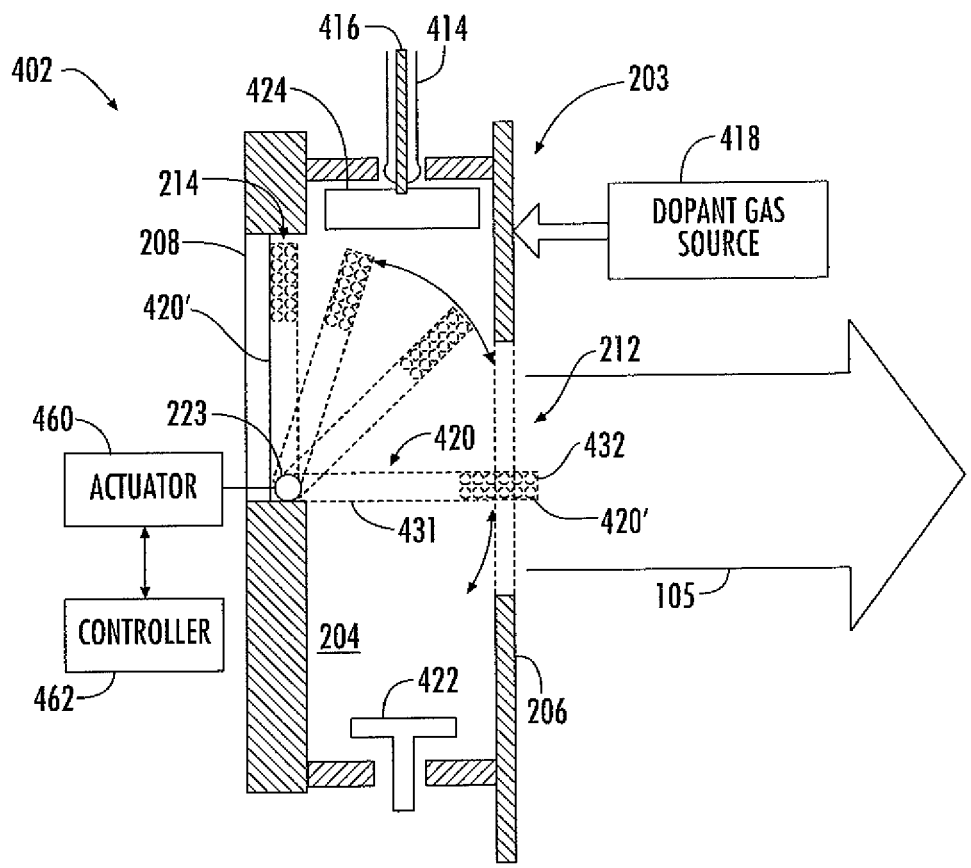
FIG. 4 is a schematic block diagram of an indirectly heated cathode ion source consistent with another embodiment of the disclosure.

Turning to FIG. 4, a schematic block diagram of an IHC ion source 402 consistent with another embodiment of the disclosure is illustrated. Compared to FIG. 2, like elements have like reference numerals and hence any repetitive description is omitted herein for clarity. The IHC ion source 402 includes a cathode 424 and a repeller 422 positioned within the arc chamber 204. The repeller 422 may be electrically isolated. A cathode insulator (not illustrated) may be positioned relative to the cathode 424 to electrically and thermally insulate the cathode 424 from the arc chamber housing 203. A filament 414 may be positioned outside the arc chamber 204 in close proximity to the cathode 424 to heat the cathode 424. A support rod 416 may support the cathode 424 and the filament 414. A dopant gas source 418 provides a dopant gas to arc chamber 204 for ionization.

An extraction electrode assembly (not illustrated) is positioned proximate the extraction aperture 212 for extraction of the well-defined ion beam 105. One or more power supplies (not illustrated) may also be provided such as a filament power supply to provide current to the filament 414 for heating thereof and an arc power supply to the bias the arc chamber housing 203.

The IHC ion source 402 also includes a controller 462 and a cleaning sub-assembly including an actuator 460 and a wiper 420. The controller 462 can be or include a general-purpose computer or network of general-purpose computers that may be programmed to perform desired input/output functions. The controller 462 can also include other electronic circuitry or components, such as application specific integrated circuits, other hardwired or programmable electronic devices, discrete element circuits, etc. The controller 462 may also include communication devices, data storage devices, and software. For clarity of illustration, the controller 462 is illustrated as providing an output signal to the actuator 460 and receiving signals from the same. Those skilled in the art will recognize that the controller 462 may provide output signals to other components of the ion source 402, e.g., associated power supplies, and flow control mechanisms for the dopant gas source 418, etc., and receive input signals from the same. The actuator 460 may include a drive mechanism to drive the wiper 420 from a parked position 420' to operational positions to clean the extraction aperture 212. The actuator 460 may also drive the wipers of all other embodiments. In this embodiment, the wiper 420 may be a brush including a handle 431 and bristles 432. The bristles 432 may be wire bristles fabricated of a refractory metal such as tungsten, molybdenum, tantalum, rhenium, and carbon and other high temperature materials including ceramics, aluminum oxide ($Al_2O_3$), sapphire, and zirconium. The handle 431 may also be fabricated of similar refractory metals.

In operation, the dopant gas source 418 provides a dopant gas to the arc chamber 204. The filament 414 is heated by an associated power supply to thermionic emission temperatures. Electrons from the filament 414 bombard the cathode 424 to thereby also heat the cathode 424 to thermionic emission temperatures. Electrons emitted by the cathode 424 may be accelerated and ionize gas molecules of the dopant gas to produce a plasma discharge. The electrons within the arc chamber 204 may be caused to follow spiral trajectories by a magnetic field from a magnetic field source to increase the number of ionizing collisions. The repeller electrode 422 builds up a negative charge to repel electrons back through the arc chamber 204 producing additional ionizing collisions. An extraction electrode assembly positioned proximate the extraction aperture 212 extracts ions from the plasma in the arc chamber 204 into a well-defined ion beam 105.

To remove undesirable deposits that may form over time on the extraction aperture 212, the controller 462 may initiate a mechanical cleaning operation. This operation may occur during a recipe change when no plasma is present in the arc chamber 204. Alternatively, the mechanical cleaning operation may occur when there is plasma present in the arc chamber 204. During the mechanical cleaning operation, the actuator 460 drives the wiper 420 from its parked position 420' in a recessed portion of the floor 208 to operational positions 420". The actuator 460 may drive the wiper 420 so it pivots about pivot point 223 and the bristles 432 sweep across portions of the face plate 206 defining the extraction aperture 212 and then returns to the parked position. This operation can take as little as 1 or 2 seconds.

Figure 5A:
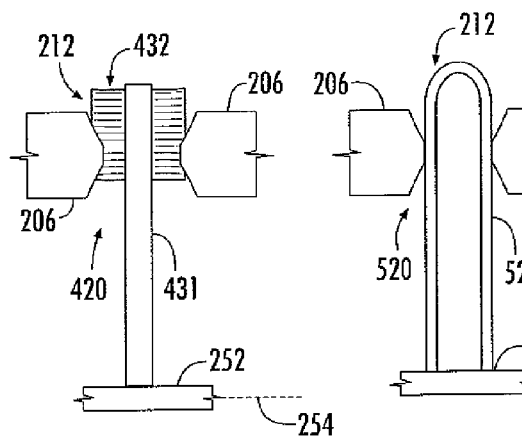
Figure 5B:
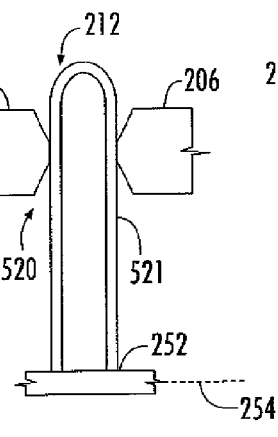
Figure 5C:
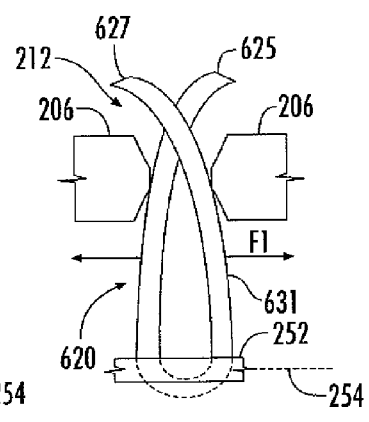

Turning to FIGS. 5A-5C, schematic front views of different wiper embodiments viewed generally along the line 5-5 of FIG. 2 are illustrated. FIG. 5A illustrates the wiper 420 consistent with that illustrated in FIG. 4. The wiper 420 includes a handle 431 and bristles 432 as earlier detailed. As the shaft 252 is rotated about its axis 254, bristles 432 are swept across the extraction aperture 212. The length of the handle 431 and the area occupied by the bristles 432 may be selected based on dimensions of the arc chamber housing 203 and extraction aperture 212 to maximize bristle contact with the extraction aperture 212. FIG. 5B illustrates another embodiment of a wiper 520. The wiper 520 includes a wire 521 bent in a generally U-shaped configuration. The wire 521 may be fabricated of tungsten, tantalum, molybdenum, rhenium, or carbon and other high temperature materials including ceramics, aluminum oxide ($Al_2O_3$), sapphire, and zirconium to contact portions of the face plate 206 defining the extraction aperture 212.

FIG. 5C in conjunction with FIG. 6 illustrates yet another embodiment of a wiper 620. The wiper 620 includes a wire 631 that may be fabricated of tungsten, tantalum, molybdenum, rhenium, or carbon and other high temperature materials including ceramics, aluminum oxide ($Al_2O_3$), sapphire, and zirconium. The wire 631 has a first leg 680 having a first end 625 and a second leg 682 having a second end 627. With the legs 680, 682 unrestrained, the two unattached ends 625, 627 are generally proximate one another as illustrated in the parked position 620' of FIG. 6. The two legs 680, 682 when unrestrained form a generally elongated oval shape having a maximum width (W1) between each leg 680, 682 as illustrated in the parked position 620'. This maximum width is wider than the width (W3) of the extraction aperture 212. The length of the legs 680, 682 may be selected so that the ends 625, 627 just enter one end of the extraction aperture 212 as they are pivoted about the pivot point 223.

As the legs 680, 682 continue to pivot about the pivot point 223, the first leg 680 having end 625 contacts one edge 692 of the extraction aperture 212, while the second leg 682 having end 627 contacts an opposing edge 690 of the extraction aperture 212. Further pivoting of the legs 680, 682 cause each to be forced toward one another by edges 690, 692 of the extraction aperture 212. The ends 625, 627 of each leg 680, 682 therefore cross one another as the maximum distance between each leg 680, 682 decreases to width (W2), where W2<W1 when the legs 680, 682 are in about the center of the extraction aperture 212. Advantageously, the elasticity of the legs 680, 682 creates a biasing force (F1) that urges each leg 680, 682 against the edges 692, 690 of the extraction aperture 212 to further clean the same.

Figure 5D:
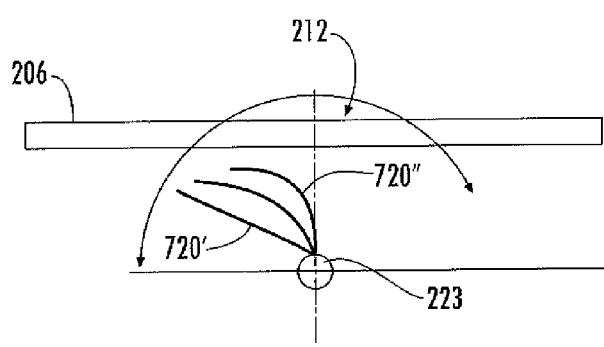
Figure 5E:
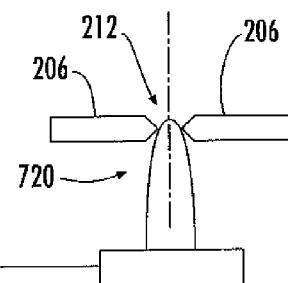

Turning to FIGS. 5D and 5E, views of another embodiment of a wiper 720 consistent with the disclosure is illustrated. FIG. 5D illustrates a side cross sectional view of the wiper 720 as it pivots about the pivot point 223 to sweep across the extraction aperture 212. FIG. 5E is a front view of the wiper 720 when viewed from a similar vantage point as the line 5-5 of FIG. 2. The wiper 720 may be a spring plate fabricated of tungsten, tantalum, molybdenum, rhenium, or carbon and other high temperature materials including ceramics, aluminum oxide ($Al_2O_3$), sapphire, and zirconium. In operation, the spring plate is configured to deform or flex when it encounters resistance as it is swept across the extraction aperture 212. For example, when the spring plate wiper 720 is at position 720' it is relatively straight. However, when the spring plate wiper 720 is driven towards the extraction aperture 212 and is at position 720", it may flex backwards at it encounters resistance from the extraction aperture 212.

Turning to FIGS. 5F and 5G, views of another embodiment of a wiper 820 consistent with the disclosure is illustrated. FIG. 5F illustrates a side cross sectional view of the wiper 820 as it pivots about the pivot point 223 to sweep across the extraction aperture 212. FIG. 5G is a front view of the wiper 820 when viewed from a similar vantage point as the line 5-5 of FIG. 2. The wiper 820 may include a shaft 848, a tip 840, a shelf 846, and a spring 842 disposed about the shaft 848 and biased against the shelf 846. The tip 840, shaft 848, and shelf 846 may be fabricated of tungsten (W), tantalum (Ta), molybdenum (Mo), rhenium (Re), carbon (C), or aluminum oxide ($Al_2O_3$), ceramics, sapphire, and zirconium or any combination thereof.

In operation, the spring loaded wiper 820 is driven to pivot about the pivot point 223. As the tip 840 contacts the extraction aperture 212 to clean the same, the shaft 848 is configured to compress or shorten relative to its length in a non-contacting position as illustrated in position 820" of FIG. 5F. Advantageously, the spring 842 is biased against the shelf 846 to urge the tip 840 back towards the extraction aperture 212 to provide an additional biasing force to urge the tip 840 against the extraction aperture.

Figure 7:
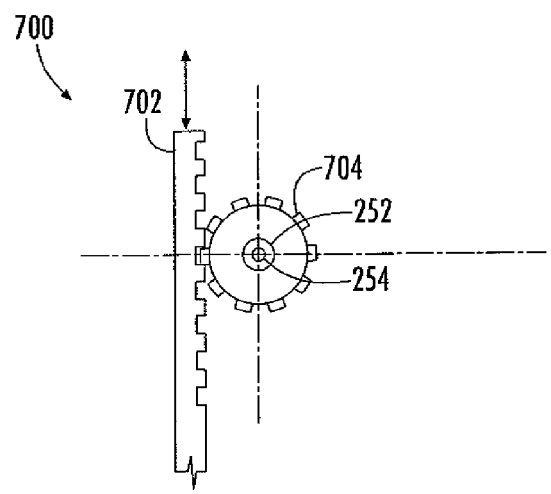
FIG. 7 is a schematic view of a gear train assembly to drive a wiper.

Turning to FIG. 7, one gear train assembly 700 that may be a component of a drive mechanism to drive a wiper consistent with the current disclosure is illustrated. In one instance, the gear train assembly 700 may be a component of the actuator 460 illustrated in FIG. 4. The gear train assembly 700 includes a rack 702 and pinion 704 having gears in meshing engagement. As the rack 702 is driving linearly, the pinion 704 rotates. The shaft 252 may rotate about the axis 254 causing pivoting of a wiper fixed thereto. Those skilled in the art will recognize a number of different ways to convert linear motion to rotary motion. For instance, a crank pin with connecting linkage similar to that sometimes employed with vehicle windshield wipers may also be used to drive the wiper.

Figures 8A, 8B:
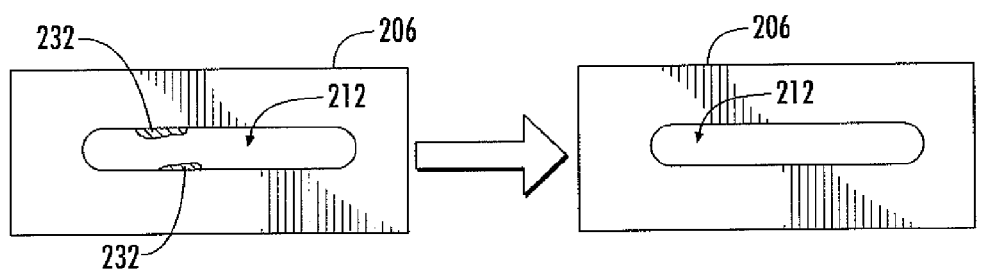
FIGS. 8A and 8B are front views of a face plate and extraction aperture before and after cleaning with a wiper.

FIGS. 8A and 8B illustrate front views of the face plate 206 and extraction aperture 212 before and after a wiper clean operation consistent with the disclosure. FIG. 8A illustrates undesirable deposits 232 formed on edges of the face plate 206 defining the extraction aperture 212. After a mechanical wiper clean operation, most, if not all, of the undesirable deposits 232 are removed as illustrated in FIG. 8B.

Accordingly, there is provided a wiper positioned within an arc chamber of an ion source in a parked position, and configured to be driven to operational positions to clean the extraction aperture of the ion source. This mechanical cleaning process may take as little as 1 or 2 seconds while other conventional gas cleaning techniques take as long as 10-60 minutes. This reduction in cleaning time improves the overall throughput of an ion implanter utilizing the ion source. In addition, beam uniformity output the extraction aperture is improved resulting in dose uniformity improvement at the workpiece plane. Accordingly, beam current of the ion beam may be maintained at a higher level compared to conventional techniques that lower beam current to address beam uniformity issues caused by deposits blocking portion of the extraction aperture. Furthermore, ion source lifetime may also be improved.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source comprising:
    an arc chamber housing defining an arc chamber having an extraction aperture; and
    a wiper positioned within the arc chamber in a parked position and configured to be driven from the parked position to operational positions to clean the extraction aperture.

2. The ion source of claim 1, wherein the arc chamber housing comprises:
    a face plate having portions defined the extraction aperture, and
    a floor positioned opposite the face plate, wherein the floor has a recessed portion to accept the wiper in the parked position.

3. The ion source of claim 1, wherein the wiper comprises a wire.

4. The ion source of claim 3, wherein the wire comprises at least one of tungsten, molybdenum, tantalum, rhenium, and carbon.

5. The ion source of claim 3, wherein a first edge of the arc chamber housing and a second edge of the arc chamber housing partly define the extraction aperture, and wherein the wire is configured to have a first leg with a first end and a second leg with a second end, wherein the first leg is configured to contact the first edge and the second leg is configured to contact the second edge while the first end and second ends cross each other in one of the operational positions.

6. The ion source of claim 1, wherein the wiper has a first end secured to a pivot point and a second unsecured end configured to travel an arced path to contact portions of the arc chamber housing defining the extraction aperture when the wiper is driven about the pivot point to the operational positions.

7. The ion source of claim 6, wherein the wiper is configured to bend when the second unsecured end contacts the portions of the arc chamber housing defining the extraction aperture.

8. The ion source of claim 1, wherein the wiper comprises a shaft having a first end secured to a pivot point, a tip coupled to a second unsecured end of the shaft, a shelf coupled to the shaft, and a spring disposed about the shaft having one end positioned against the shelf, wherein the spring provides a biasing force against the shelf to urge the tip against portions of the arc chamber housing defining the extraction aperture when the wiper is driven about the pivot point to the operational positions.

9. A cleaning sub-assembly for an ion source, comprising:
a wiper configured to be positioned within an arc chamber of the ion source when in a parked position and driven from the parked position to operational positions to clean an extraction aperture of the ion source.

10. The cleaning sub-assembly of claim 9, wherein the wiper comprises a wire.

11. The cleaning sub-assembly of claim 10, the wire comprises at least one of tungsten, molybdenum, tantalum, rhenium, and carbon.

12. The cleaning sub-assembly of claim 10, wherein a first edge and a second edge of a face plate of the ion source partly define the extraction aperture, and wherein the wire is configured to have a first leg with a first end and a second leg with a second end, wherein the first leg is configured to contact the first edge and the second leg is configured to contact the second edge while the first end and second ends cross each other in one of the operational positions.

13. The cleaning sub-assembly of claim 9, wherein the wiper has one end secured to a pivot point and a second unsecured end configured to travel an arced path to clean the extraction aperture when the wiper is driven about the pivot point to the operational positions, and wherein the wiper is configured to bend when the second unsecured end contacts the portions of the arc chamber housing defining the extraction aperture.

14. The cleaning sub-assembly of claim 9, wherein the wiper comprises a shaft having a first end secured to a pivot point, a tip coupled to a second unsecured end of the shaft, a shelf coupled to the shaft, and a spring disposed about the shaft having one end positioned against the shelf, wherein the spring provides a biasing force against the shelf to urge the tip against portions of an arc chamber housing defining the extraction aperture when the wiper is driven about the pivot point to the operational positions.

* * * * *